(12) United States Patent
Bi et al.

(10) Patent No.: US 10,553,445 B2
(45) Date of Patent: *Feb. 4, 2020

(54) STACKED NANOWIRES

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/160,366

(22) Filed: Oct. 15, 2018

(65) Prior Publication Data

US 2019/0051535 A1    Feb. 14, 2019

Related U.S. Application Data

(60) Continuation of application No. 15/640,782, filed on Jul. 3, 2017, now Pat. No. 10,128,122, which is a (Continued)

(51) Int. Cl.
*H01L 21/3105* (2006.01)
*H01L 29/66* (2006.01)
(Continued)

(52) U.S. Cl.
CPC .... *H01L 21/3105* (2013.01); *H01L 21/02532* (2013.01); *H01L 21/02603* (2013.01); (Continued)

(58) Field of Classification Search
CPC ......... H01L 21/02532; H01L 21/02603; H01L 21/30608; H01L 21/3105; H01L 21/324; (Continued)

(56) References Cited

U.S. PATENT DOCUMENTS 7,566,364 B2   7/2009 Xianyu et al.
7,601,570 B2   10/2009 Damlencourt
(Continued)

OTHER PUBLICATIONS

List of IBM Patents or Applications Treated as Related (2 pages).

*Primary Examiner* — Allan R Wilson
(74) *Attorney, Agent, or Firm* — Vazken Alexanian; Michael J. Chang, LLC

(57) ABSTRACT

Techniques for producing stacked SiGe nanowires using a condensation process without parasitic Ge nanowires as an undesired by-product. In one aspect, a method of forming SiGe nanowires includes the steps of: forming a stack of alternating Si and SiGe layers on a wafer; patterning fins in the stack; selectively thinning the SiGe layers in the fins such that the Si and SiGe layers give the fins an hourglass shape; burying the fins in an oxide material; and annealing the fins under conditions sufficient to diffuse Ge from the SiGe layers in the fins to the Si layers in the fins to form the SiGe nanowires. A FET device and method for formation thereof are also provided.

18 Claims, 12 Drawing Sheets

Related U.S. Application Data division of application No. 14/880,659, filed on Oct. 12, 2015, now Pat. No. 9,716,142.

(51) Int. Cl.
*H01L 29/78* (2006.01)
*H01L 29/417* (2006.01)
*H01L 29/423* (2006.01)
*H01L 21/02* (2006.01)
*H01L 21/306* (2006.01)
*H01L 29/775* (2006.01)
*H01L 21/324* (2006.01)
*H01L 29/06* (2006.01)
*H01L 29/786* (2006.01)

(52) U.S. Cl.
CPC ...... *H01L 21/30608* (2013.01); *H01L 21/324* (2013.01); *H01L 29/0676* (2013.01); *H01L 29/41791* (2013.01); *H01L 29/42392* (2013.01); *H01L 29/66439* (2013.01); *H01L 29/66545* (2013.01); *H01L 29/66553* (2013.01); *H01L 29/66795* (2013.01); *H01L 29/775* (2013.01); *H01L 29/785* (2013.01); *H01L 29/78696* (2013.01); *H01L 2029/7858* (2013.01)

(58) Field of Classification Search
CPC .......... H01L 29/0676; H01L 29/41791; H01L 29/42392; H01L 29/66439; H01L 29/66545; H01L 29/66553; H01L 29/66795; H01L 29/775; H01L 29/785; H01L 2029/7858

See application file for complete search history.

(56) References Cited

U.S. PATENT DOCUMENTS

| | | | |
|---|---|---|---|
| 7,892,945 | B2 | 2/2011 | Bedell et al. |
| 8,389,347 | B2 | 3/2013 | Tezuka et al. |
| 8,753,942 | B2 | 6/2014 | Kuhn et al. |
| 8,969,149 | B2 | 3/2015 | Leobandung |
| 9,024,364 | B2 | 5/2015 | Okano |
| 9,431,483 | B1 | 8/2016 | Wen et al. |
| 2004/0185583 | A1 | 9/2004 | Tomoyasu et al. |
| 2005/0106890 | A1 | 5/2005 | Schroeder et al. |
| 2010/0176426 | A1 | 7/2010 | Meunier-Bellard et al. |
| 2011/0012090 | A1 | 1/2011 | Singh et al. |
| 2011/0062417 | A1 | 3/2011 | Iwayama et al. |
| 2013/0181263 | A1 | 7/2013 | Cai et al. |
| 2014/0001441 | A1 | 1/2014 | Kim et al. |
| 2014/0042386 | A1 | 2/2014 | Cea et al. |
| 2014/0197377 | A1 | 7/2014 | Kim et al. |
| 2014/0209865 | A1 | 7/2014 | Pillarisetty et al. |
| 2015/0069328 | A1 | 3/2015 | Leobandung |
| 2015/0236051 | A1 | 8/2015 | Loubet et al. |
| 2015/0357470 | A1 | 12/2015 | Cheng et al. |
| 2016/0056236 | A1 | 2/2016 | Ching et al. |
| 2016/0064543 | A1 | 3/2016 | Cheng et al. |
| 2016/0181097 | A1 | 6/2016 | Cohen et al. |
| 2016/0204263 | A1 | 7/2016 | Mukherjee et al. |
| 2016/0254382 | A1 | 9/2016 | Hoentschel et al. |
| 2017/0117373 | A1 | 4/2017 | Ando et al. |
| 2018/0211884 | A1* | 7/2018 | Ching ............. H01L 21/823821 |
| 2018/0212023 | A1* | 7/2018 | Weber ............. H01L 21/823807 |
| 2018/0301563 | A1* | 10/2018 | Pillarisetty ........ H01L 29/42392 |
| 2019/0051725 | A1* | 2/2019 | Kim .................... H01L 29/0673 |

* cited by examiner

STACKED NANOWIRES

CROSS-REFERENCE TO RELATED APPLICATION(S)

This application is a continuation of U.S. application Ser. No. 15/640,782 filed on Jul. 3, 2017, now U.S. Pat. No. 10,128,122, which is a divisional of U.S. application Ser. No. 14/880,659 filed on Oct. 12, 2015, now U.S. Pat. No. 9,716,142, the disclosures of each of which are incorporated by reference herein.

FIELD OF THE INVENTION

The present invention relates to techniques for producing stacked nanowires, and more particularly, to producing stacked silicon germanium (SiGe) nanowires using a condensation process without parasitic germanium (Ge) nanowires as an undesired by-product.

BACKGROUND OF THE INVENTION

Silicon germanium (SiGe) nanowires are desired for p-channel field effect transistor (PFET) devices. A common technique for forming SiGe nanowires is a so-called 'condensation' process, wherein preferential oxidation of silicon (Si) and condensing Ge is used to form SiGe nanowires. However, a practical problem is found that when condensation is performed on Si/SiGe stacks, parasitic Ge nanowires (or SiGe nanowires with high Ge content) are formed.

Therefore, techniques for making SiGe nanowire channeled PFETs without the creation of parasitic Ge nanowires would be desirable.

SUMMARY OF THE INVENTION

The present invention provides techniques for producing stacked silicon germanium (SiGe) nanowires using a condensation process without parasitic germanium (Ge) nanowires as an undesired by-product. In one aspect of the invention, a method of forming SiGe nanowires is provided. The method includes the steps of: forming a stack of alternating silicon (Si) and SiGe layers on a wafer; patterning fins in the stack; selectively thinning the SiGe layers in the fins such that the Si and SiGe layers give the fins an hourglass shape; burying the fins in an oxide material; and annealing the fins under conditions sufficient to diffuse germanium (Ge) from the SiGe layers in the fins to the Si layers in the fins to form the SiGe nanowires.

In another aspect of the invention, a method of forming a field effect transistor (FET) device is provided. The method includes the steps of: forming a stack of alternating Si and SiGe layers on a wafer; patterning fins in the stack; selectively thinning the SiGe layers in the fins such that the Si and SiGe layers give the fins an hourglass shape; burying the fins in an oxide material; annealing the fins under conditions sufficient to diffuse Ge from the SiGe layers in the fins to the Si layers in the fins to form one or more stacks of SiGe nanowires; releasing the SiGe nanowires from the oxide material in a channel region of the FET device; and forming a gate surrounding a portion of each of the SiGe nanowires in the channel region of the FET device, wherein portions of the SiGe nanowires extending out from the gate serve as source and drain regions of the FET device.

In yet another aspect of the invention, a FET device is provided. The FET device includes: at least one stack of SiGe nanowires; and a gate surrounding a portion of each of the SiGe nanowires that serves as a channel region of the FET device, wherein portions of the SiGe nanowires extending out from the gate serve as source and drain regions of the FET device, and wherein the SiGe nanowires have a uniform diameter throughout the source, drain, and channel regions of the FET device.

A more complete understanding of the present invention, as well as further features and advantages of the present invention, will be obtained by reference to the following detailed description and drawings.

DETAILED DESCRIPTION OF PREFERRED EMBODIMENTS

As provided above, a condensation process is often used to form SiGe nanowires. Such a process leverages the preferential oxidation of silicon (Si) over germanium (Ge), whereby the expelled Ge can be used to form SiGe nanowires. Take for example a process wherein a fin is provided containing alternating layers of SiGe and Si. A condensation process can be employed to diffuse the Ge from the SiGe layers into the Si layers, forming SiGe nanowires. However, a problem with this process exists because some of the Ge is driven to the SiGe layer core, forming parasitic Ge nanowires in between the SiGe nanowires. See, for example, FIG. 1.

Figure 1:
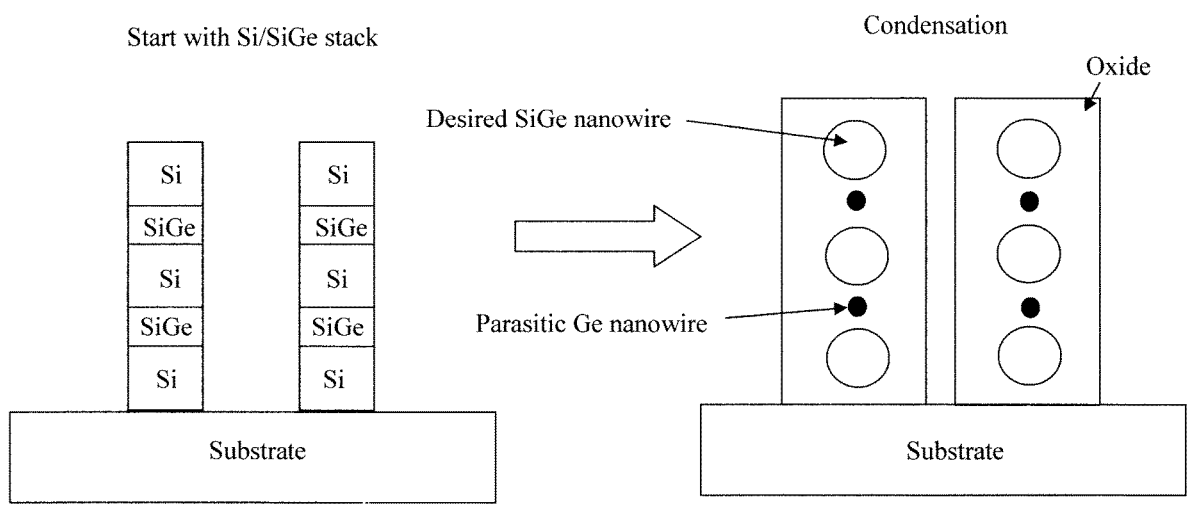
FIG. 1 is a cross-sectional diagram illustrating how use of a condensation process can lead to the formation of parasitic germanium (Ge) nanowires according to an embodiment of the present invention.

As shown in FIG. 1, beginning with a fin stack alternating Si and SiGe layers, a condensation process can be used to diffuse Ge from the SiGe layers into the Si layers, forming the desired SiGe nanowires. However, some of the Ge will get driven to the SiGe layer core, undesirably forming parasitic Ge nanowires (or SiGe nanowires with high Ge content). By parasitic it is meant unwanted (i.e., an undesired outcome of the process).

As will be described in detail below, the present process involves etching the SiGe layers in the fin stack to form an hourglass shape between the Si and SiGe layers in the stack. With a reduced amount of SiGe in between the Si layers, parasitic Ge nanowires do not form during the condensation process. Further, additional SiGe is added to the sidewalls of the Si layers in the fins to insure a proper Ge concentration in the end product SiGe nanowires.

The present techniques are now described in detail by way of reference to FIGS. 2-8. An exemplary implementation of the present techniques in forming a SiGe nanowire-based field effect transistor (FET) with hourglass-shaped inner spacers is described below by way of reference to FIGS. 9-17. Another exemplary implementation of the present techniques in forming a SiGe nanowire-based FET with oxide in between the nanowires is described below by way of reference to FIGS. 18-24.

Figure 2:
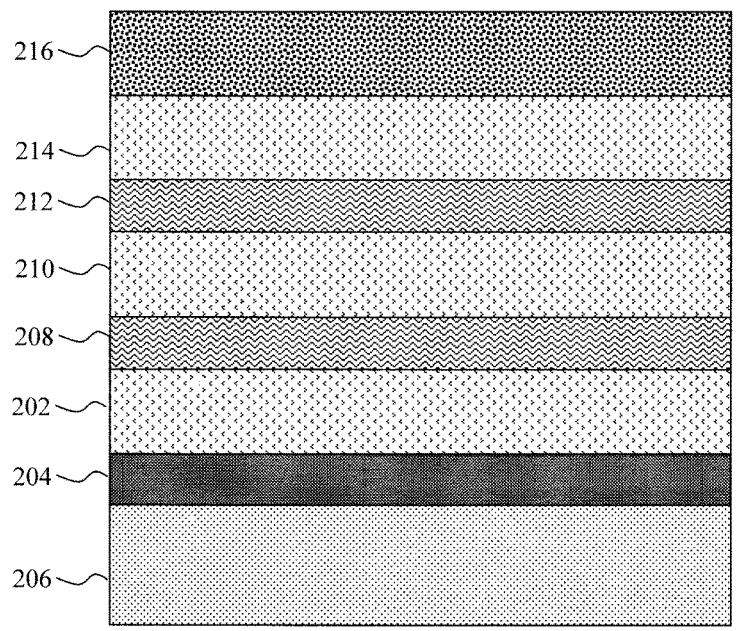
FIG. 2 is a cross-sectional diagram illustrating a starting platform for the present process that includes an alternating stack of Si and SiGe layers having been formed on an insulating substrate, and a hardmask having been formed on the stack according to an embodiment of the present invention.

As shown in FIG. 2, the starting platform for the present process includes an alternating stack of Si and SiGe layers having been formed on an insulating substrate. By way of example only, the device structure shown in FIG. 2 can be formed starting with a silicon-on-insulator (SOI) wafer. As is known in the art, an SOI wafer includes an SOI layer (e.g., SOI layer 202) separated from a substrate (e.g., substrate 206) by a buried insulator (e.g., buried insulator 204). See FIG. 2. Suitable substrate materials include, but are not limited to, silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), or any combination thereof. Suitable dielectric materials for the buried insulator 104 include, but are not limited to, an oxide material such as silicon dioxide ($SiO_2$). When the buried insulator is an oxide, the buried insulator may also be referred to as a buried oxide or BOX.

Next, with the SOI layer 202 serving as the first (Si) layer in the stack, an alternating stack of Si and SiGe layers are formed on the SOI wafer. Namely, as shown in FIG. 2 a SiGe layer 208 is formed on SOI layer 202, a Si layer 210 is formed on the SiGe layer 208, and so on. In the exemplary configuration shown in FIG. 2, there are Si layers 202, 210, and 214, and SiGe layers 208 and 212. This is however only an example, and fewer or more Si and/or SiGe layers may be implemented in the same manner described. According to an exemplary embodiment, each of the Si and SiGe layers in the stack is grown epitaxially on the SOI wafer. For instance, an epitaxial SiGe layer 208 can be grown on the SOI layer 202, an epitaxial Si layer 210 can be grown on the epitaxial SiGe layer 208, and so on.

A hardmask 216 is then formed on the top of the stack. By way of example only, a suitable hardmask material is silicon nitride (SiN). The hardmask 216 is then patterned (e.g., using standard lithography and etching techniques) with the footprint and location of one or more fins. See FIG. 3. The hardmask 216 now patterned into one or more individual fin hardmasks a, b, etc. will now be given the reference numerals 216a, 216b, etc.

Figure 3:
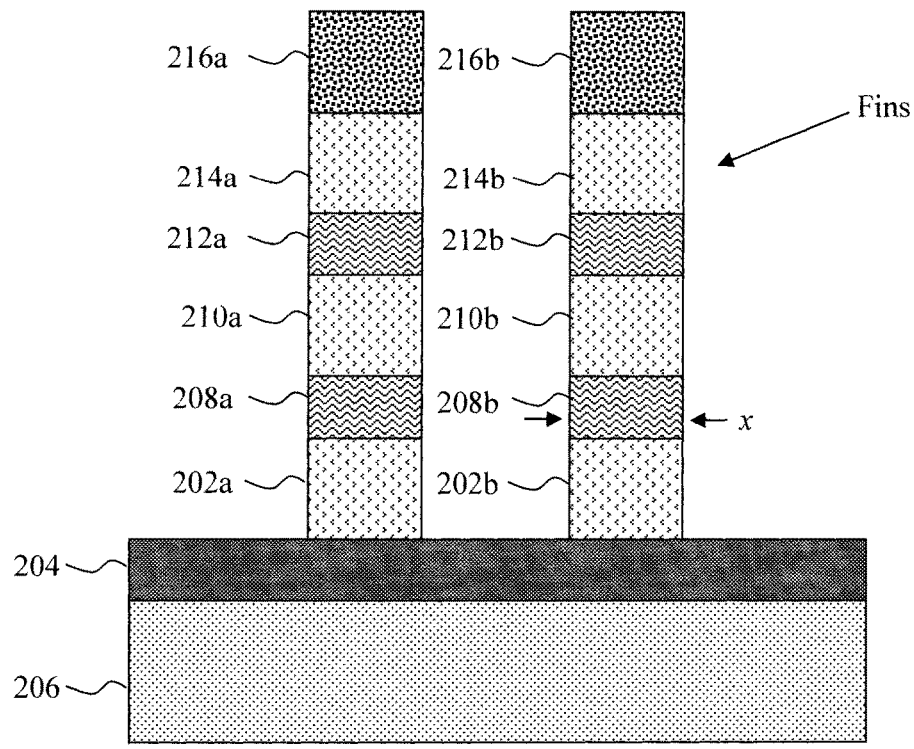
FIG. 3 is a cross-sectional diagram illustrating the hardmask having been patterned into a plurality of individual fin hardmasks, and the fin hardmasks having been used to pattern fins in the stack according to an embodiment of the present invention.

As shown in FIG. 3, the fin hardmasks 216a, b, etc. are then used to pattern one or more fins in the stack. The layers of the stack patterned into one or more individual fins a, b, etc. will now be given the reference numerals 202a, b, 208a, b, etc.

Figure 4:
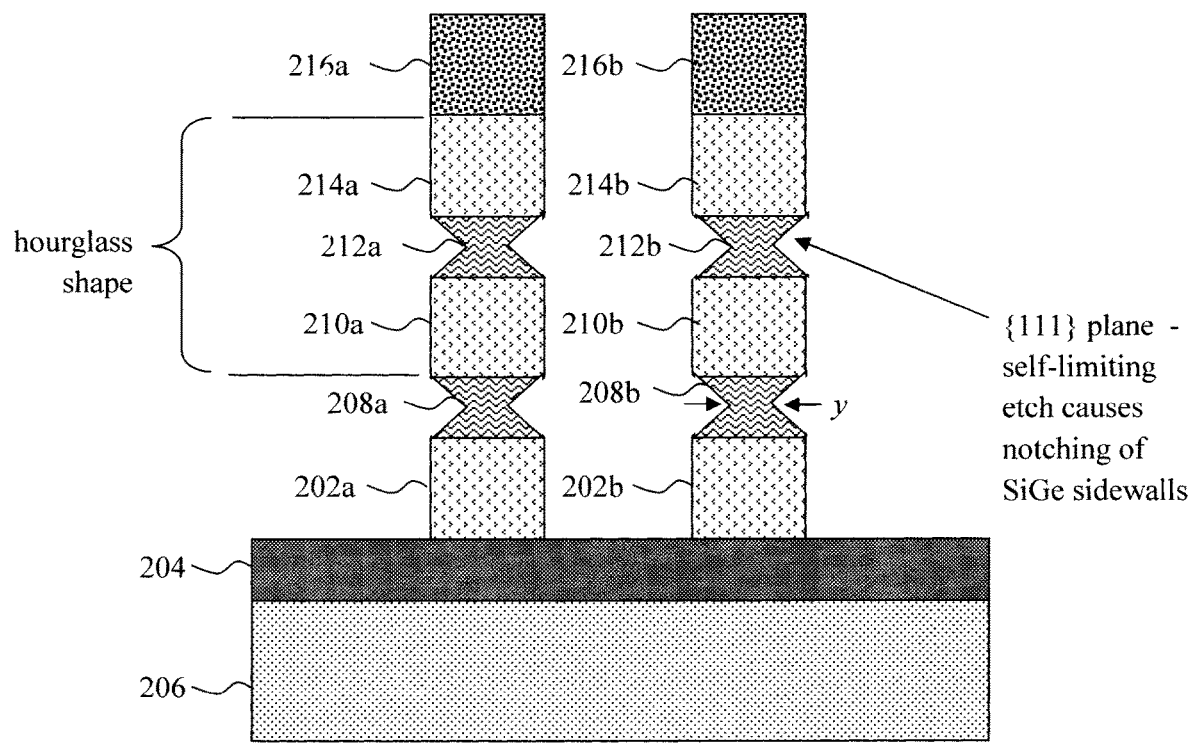
FIG. 4 is a cross-sectional diagram illustrating the SiGe layers within the fin stacks having been selectively thinned giving the Si and SiGe layers an hourglass shape according to an embodiment of the present invention.
Figure 5:
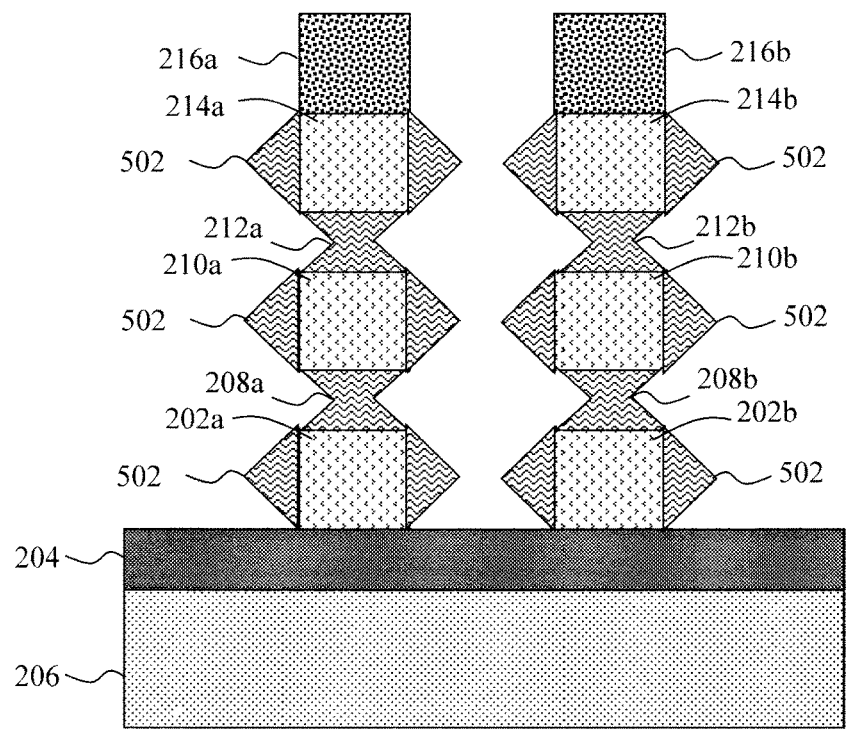
FIG. 5 is a cross-sectional diagram illustrating SiGe having been added back to the fin stack, i.e., grown in a faceted way onto the sidewalls of the Si layers in the fin stack according to an embodiment of the present invention.

As highlighted above, in order to prevent the formation of parasitic Ge nanowires during the condensation process, the SiGe layers within the fin stacks are selectively thinned (i.e., relative to the Si layers) so as to reduce the amount of SiGe in between each of the Si layers. See FIG. 4. According to an exemplary embodiment, a selective anisotropic wet etching process, such as in hydrogen peroxide ($H_2O_2$), is used in this step to etch the SiGe layers in the fin stack selective to the Si layers. Being selective for SiGe, this wet etch chemistry will affect only the exposed sidewalls of the SiGe layers in each fin. Further, this type of wet etching process is self-limiting once the {111} crystallographic planes of the SiGe layers in the fin stack are exposed. As shown in FIG. 4, this results in a v-shaped notching of the SiGe layers in the fin stack. This configuration of the (wider) Si layers in the fin stack being separated by a notched and thus narrower SiGe layer is characterized herein as having an hourglass shape. To further illustrate this process, compare, FIGS. 3 and 4 where prior to thinning, the SiGe layers in the stack have a width x (see FIG. 3) and post-thinning, the SiGe layers in the stack have at their thinnest point a width y (see FIG. 4), wherein x>y. By way of example only, x can be from about 5 nanometers (nm) to about 100 nm, and ranges therebetween, and y can be from about 1 nm to about 96 nm, and ranges therebetween.

In order to insure that there is a proper Ge concentration in the nanowires, SiGe 502 is added back to the fin stack. See FIG. 5. However, the SiGe is added (e.g., grown) on the exposed sidewalls of the Si layers in the fin stack. Thus, as a result, SiGe will be present on the sidewalls as well as the top and/or bottom of each Si layer in the fin stack. According to an exemplary embodiment, epitaxial SiGe is grown on the sidewalls of the Si layers in the fin stack. Epitaxial SiGe will grow only on the (Si) sidewalls which have a {110} crystallographic plane and the growth virtually stops once {111} planes are formed. As a result, the epitaxial SiGe grows on the sidewalls of the Si layers in a faceted way. The epitaxial growth of SiGe can be of any amount before excessive growth occurs at the etched SiGe facets. See FIG. 5.

Figure 6:
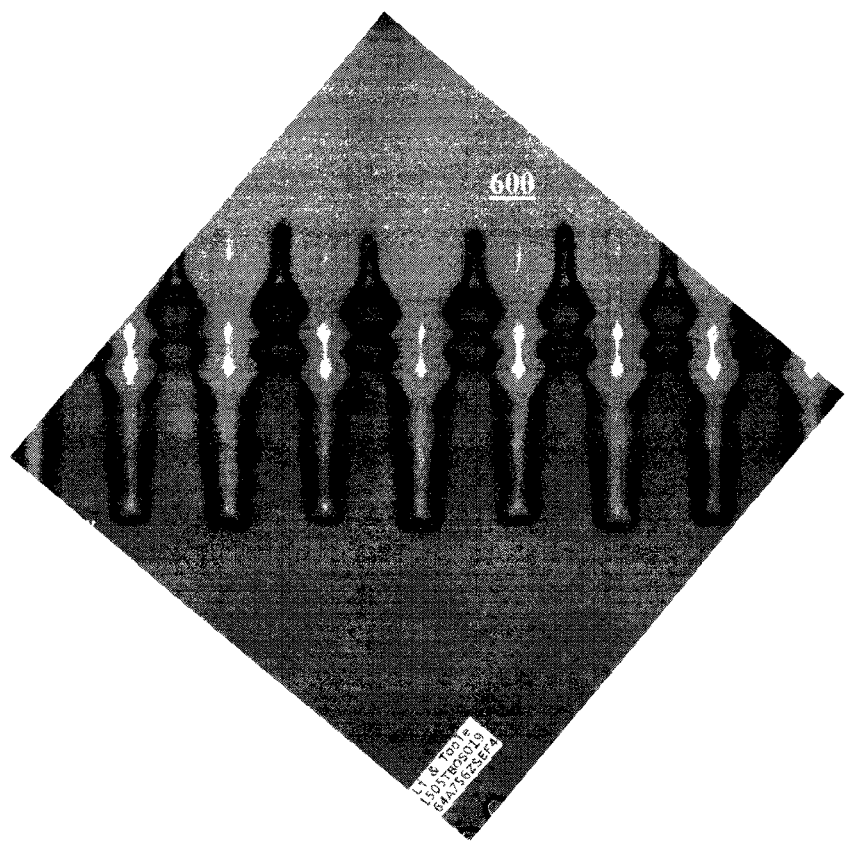
FIG. 6 is an image of a sample of the fin stack after the SiGe sidewall etch and after the layer of epitaxial SiGe has been grown on the Si sidewalls according to an embodiment of the present invention.

Referring briefly to FIG. 6, an image 600 is shown of the hourglass shape of the fin stacks after the SiGe sidewall etch and after the layer of epitaxial SiGe has been grown on the Si sidewalls. As shown in FIG. 6, the epitaxial SiGe grows on the Si sidewalls in a faceted manner.

Figure 7:
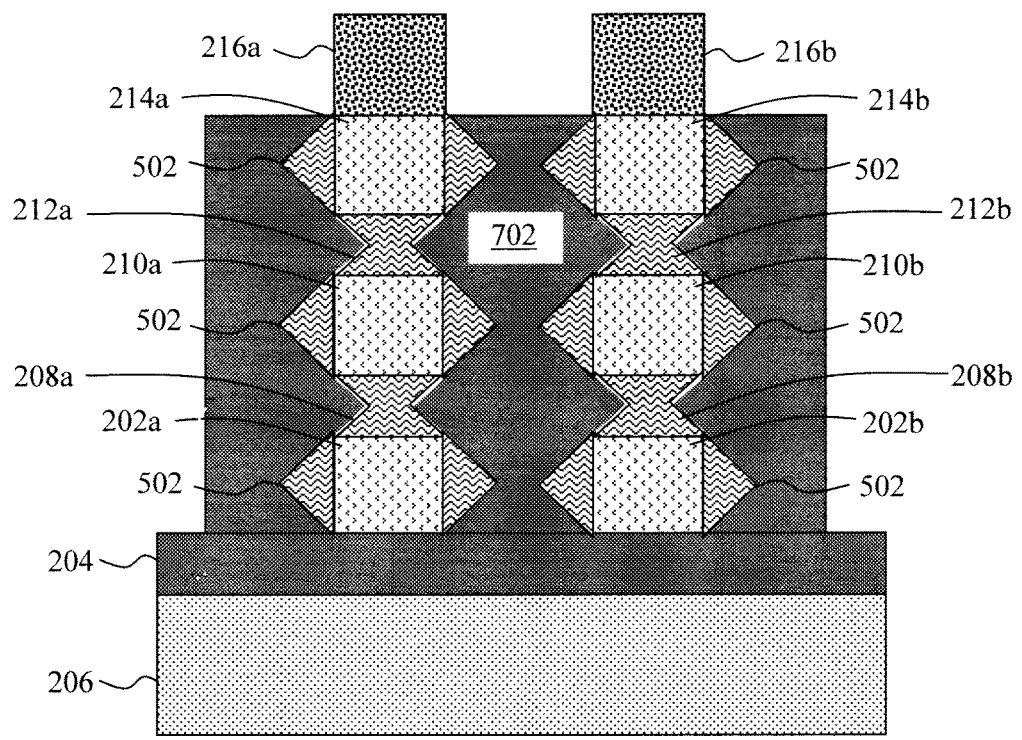
FIG. 7 is a cross-sectional diagram illustrating an oxide material having been deposited onto the structure, burying the fin stacks according to an embodiment of the present invention.
Figure 8:
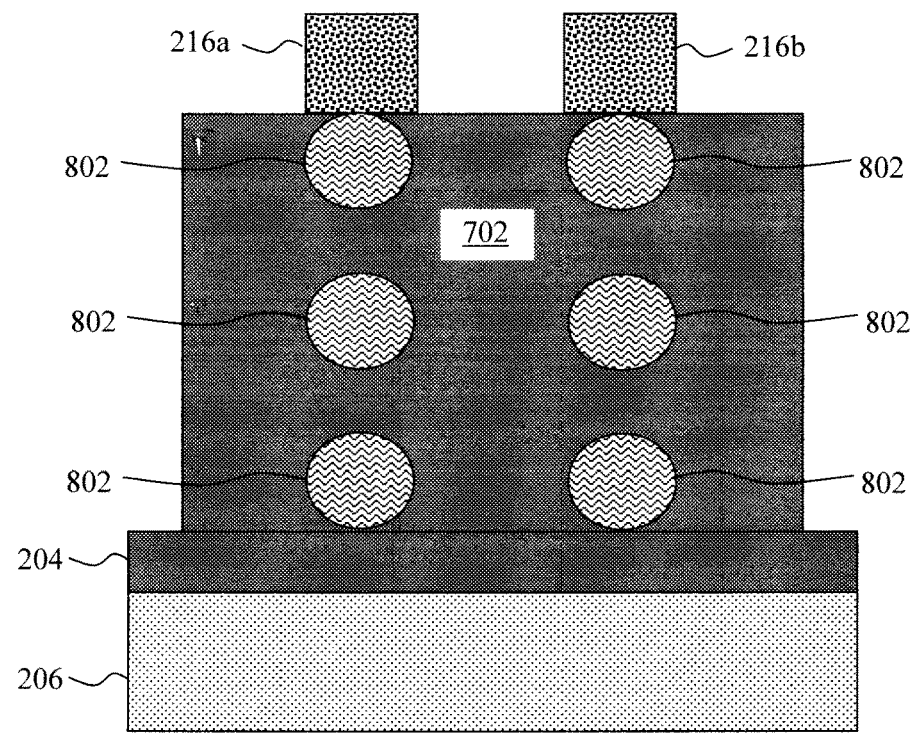
FIG. 8 is a cross-sectional diagram illustrating a thermal oxidation (condensation) process having been used to form SiGe nanowires according to an embodiment of the present invention.

In order to provide mechanical support during the following condensation process (to be performed as described below), an oxide material 702 is next deposited onto the structure, burying the fin stacks. See FIG. 7. Namely, as shown in FIG. 7 the oxide 702 is deposited surrounding and in between the fins. According to an exemplary embodiment, the oxide material 702 is a flowable oxide. Suitable flowable oxide materials are available, for example, from Dow Corning Corporation, Midland Mich. Flowable oxides can be cast onto a substrate, e.g., using spin-coating, and then heated to melt and flow the film. This will insure complete coverage around and in between the fins. As shown in FIG. 7, a recess etch of the oxide 702 can be performed to expose the fin hardmasks 216a,b.

A thermal oxidation (condensation) process is then carried out to form SiGe nanowires 802. See FIG. 8. The thermal oxidation process generally involves annealing the fin stack in an oxidizing environment (such as an oxygen ($O_2$) ambient, in the presence of high purity steam or water vapor etc. as an oxygen source) under conditions sufficient to diffuse Ge from the SiGe layers in the fin stack to the Si layers in the fin stack to form the SiGe nanowires 802. The other product of the oxidation is silicon dioxide which can be removed using standard processes. According to an exemplary embodiment, the annealing conditions include: a temperature of from about 900° C. to about 1200° C., and ranges therebetween, for a duration of from about 1 minute to about 3 hours, and ranges therebetween. When the oxidation is performed in an $O_2$ ambient, the conditions may further include an $O_2$ pressure of from about 0.01 atmospheres (atm) to about 100 atm, and ranges therebetween. The source for the Ge during this condensation process is both the original SiGe layers in fin stack 208, 212, etc. and the SiGe 502 added back to the fins stack (i.e., to the sidewalls of the Si layers in the fin stack—see the description of FIG. 5, above).

As described above, the process of thinning the SiGe layers in the fin stack reduces the amount of SiGe present between the Si layers during the condensation process thereby preventing the formation of parasitic Ge nanowires as an unwanted by-product. See FIG. 1. Further, by adding SiGe back to the stack (but to the sidewalls of the Si layers) the Ge concentration in the SiGe nanowires 802 can be maintained, without creating parasitic Ge nanowires. According to an exemplary embodiment, the SiGe nanowires 802 contain from about 10% to about 60% Ge, and ranges therebetween.

The result of the above-described process is stacks of SiGe nanowires 802 embedded in the oxide material 702. The now-formed stacks of SiGe nanowires 802 can be used for a multitude of different device configurations and applications. By way of example only, an exemplary process for forming a SiGe nanowire-based FET is now described by way of reference to FIGS. 9-17. It is notable however that this is merely one exemplary, non-limiting implementation of the present techniques.

Figure 9:
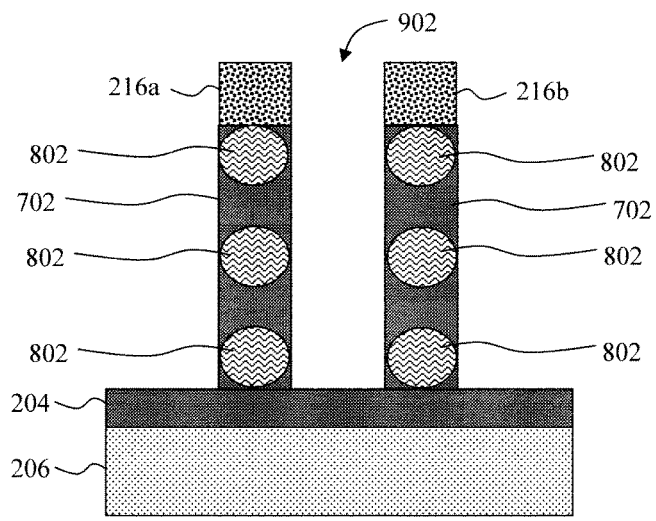
FIG. 9 is a cross-sectional diagram illustrating, according to an exemplary implementation of the present techniques for forming a SiGe nanowire-based field effect transistor (FET), one or more trenches having been patterned in the oxide material between the stacks of SiGe nanowires according to an embodiment of the present invention.

As shown in FIG. 9, one or more trenches 902 are patterned in the oxide material 702 between the stacks of SiGe nanowires 802. Advantageously, since the fin hardmasks 216 are still in place, they can be used in this step to pattern the trenches 902 and, as a result, the trenches 902 will be aligned to the stacks of SiGe nanowires 802. By way of example only, the trenches 902 can be formed using an oxide-selective reactive ion etch (RIE) process, after which the fin hardmasks 216 can be removed.

The present example follows a replacement gate process flow wherein a sacrificial gate (also referred to herein as a dummy gate) serves as a placeholder early in the process which permits placement of the source and drain regions. The dummy gate is then removed and replaced with a replacement gate. During the gate replacement, the nanowires can be suspended in the channel region allowing for a gate-all-around (or GAA) configuration.

To begin the dummy gate process, a dummy gate material (e.g., poly-silicon (poly-Si)) is deposited onto the wafer, burying the nanowire stacks. A hardmask material (e.g., a nitride hardmask material) is then deposited onto the dummy gate material and patterned with the footprint and location of one or more dummy gates. Suitable dummy gate materials include, but are not limited to, poly-silicon (poly-Si), and suitable hardmask materials include, but are not limited to, a nitride material such as silicon nitride (SiN). The patterned dummy gate hardmask 1002 is then used to pattern the dummy gate material to form a dummy gate(s) 1004. See FIGS. 10 and 11.

Figure 10:
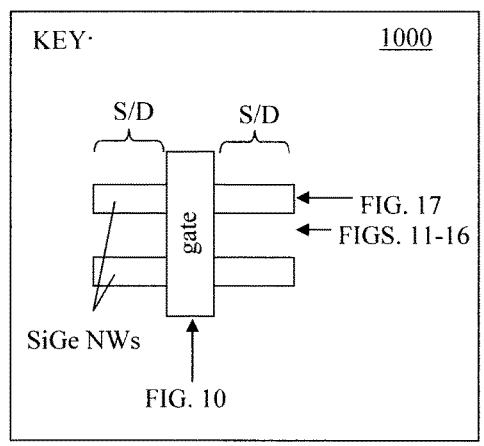
FIG. 10 is a cross-sectional diagram illustrating a dummy gate hardmask and a dummy gate having been formed over the stacks of SiGe nanowires from a cut along the dummy gate according to an embodiment of the present invention.
Figure 10:
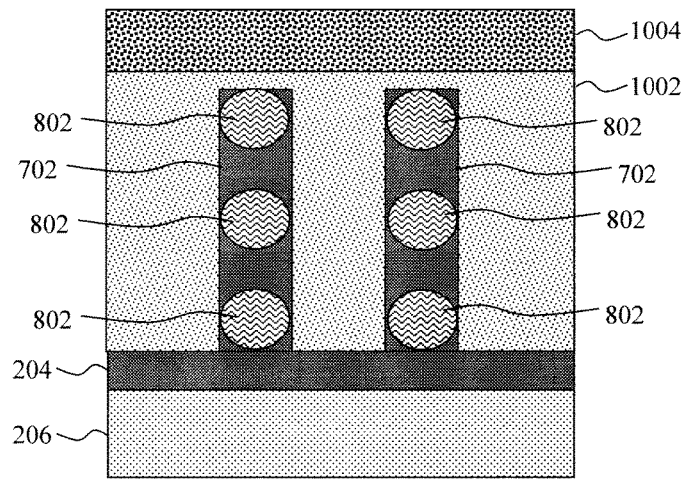
Figure 11:
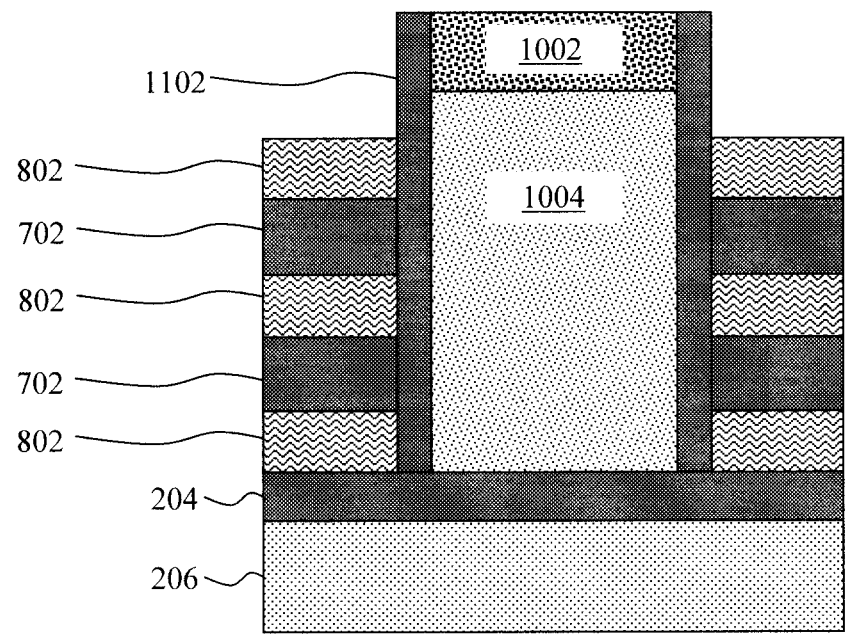
FIG. 11 is a cross-sectional diagram illustrating a dummy gate hardmask and a dummy gate having been formed over the stacks of SiGe nanowires from a cut along the source and drain regions according to an embodiment of the present invention.

A key 1000 is provided (to the left of FIG. 10) which shows the orientation of the views depicted in FIGS. 10 and 11. Specifically, the key 1000 is from a top-down perspective of the structure and shows the gate over the stacks of SiGe nanowire (labeled "SiGe NWs"). The gate shown in the key 1000 is generic for the dummy gate or the replacement gate. Further, the key 1000 illustrates that the portions of the SiGe nanowires extending out from the gate will serve as the source and drain regions (labeled "S/D") of the device. The portions of SiGe nanowires covered by the gate will serve as a channel region of the device. Thus, based on the key 1000, FIG. 10 shows the dummy gate hardmask 1002 and patterned dummy gate 1004 along the length of the gate, and FIG. 11 is a cross-sectional depiction of the dummy gate hardmask 1002 and patterned dummy gate 1004 along the source to drain regions. Thus, based on the key 1000, FIG. 10 illustrates a cross-sectional cut along the dummy gate 1004, and FIG. 11 illustrates a side view of the source to drain region from a cross-sectional cut between two of the stacks of the SiGe nanowires 802. As highlighted above, the dummy gate 1004 is formed over portions of the SiGe nanowires 802 that will serve as a channel region of the device. The portions of the SiGe nanowires 802 extending out from the dummy gate 1004 will serve as source and drain regions of the device.

As shown in FIG. 11 dummy gate spacers 1102 are formed on opposite sides of the dummy gate 1004. Spacers 1102 can be formed by blanket depositing a spacer material onto the structure, and then patterning the spacer material into spacers 1102. Suitable spacer materials include, but are not limited to, a nitride material such as SiN. FIGS. 12-16 will depict the same perspective of the device structure as that of FIG. 11 (i.e., a side view of the source to drain from a cut between two of the nanowire stacks). See key 1000.

Figure 12:
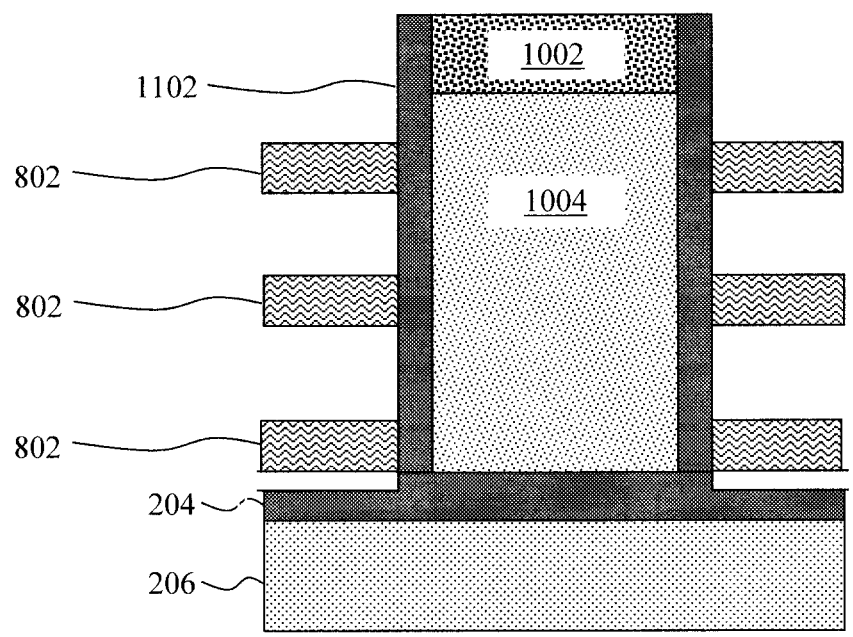
FIG. 12 is a cross-sectional diagram illustrating the oxide material having been removed from between the stacks of the SiGe nanowires in the source and drain regions of the device, releasing the SiGe nanowires in the source and drain regions of the device according to an embodiment of the present invention.
Figure 13:
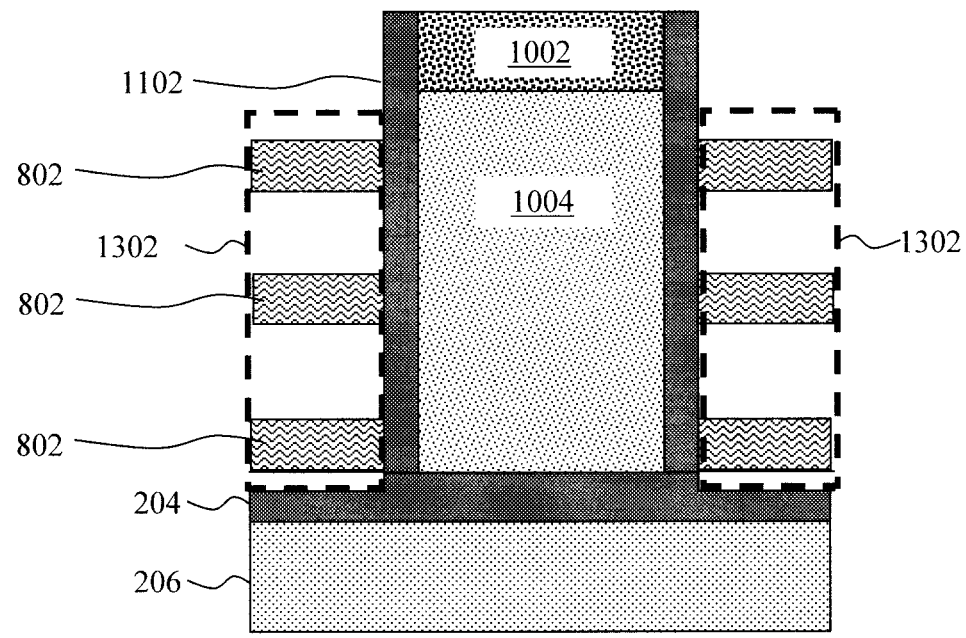
FIG. 13 is a cross-sectional diagram illustrating doped source and drain regions of the device having been formed according to an embodiment of the present invention.
Figure 14:
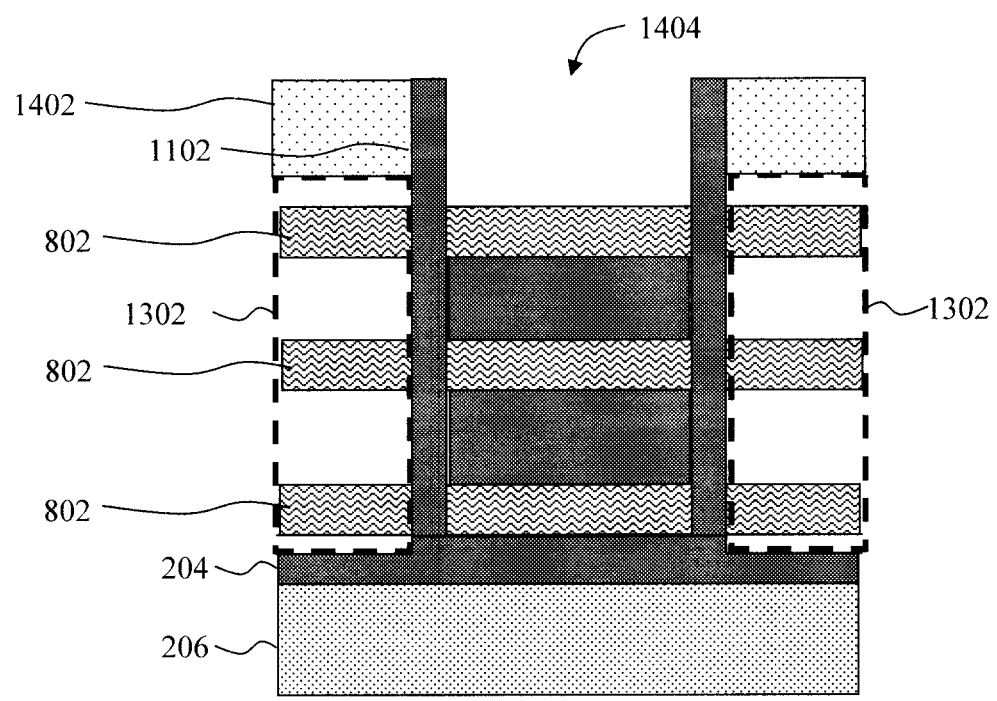
FIG. 14 is a cross-sectional diagram illustrating a dielectric material having been deposited onto the structure and the dummy gate having been removed selective to the dielectric material forming a trench (i.e., a gate trench) in the dielectric material according to an embodiment of the present invention.

As shown in FIG. 12, the oxide material 702 is next removed from between the stacks of the SiGe nanowires 802 in the source and drain regions of the device, fully releasing the SiGe nanowires 802 in the source and drain regions of the device. It is notable that the oxide material 702 and the dummy gate 1004 remain surrounding the stacks of SiGe nanowires 802 in the channel region of the device, thus providing mechanical support for the nanowires during the source and drain region processing. According to an exemplary embodiment, the oxide material 702 is removed from the nanowire stacks in the source and drain regions using an oxide-selective etching process. Preferably an isotropic etching process, such as wet or chemical etching, is used in order to clear all of the oxide material 702 from under the nanowires in the stacks. The SiGe nanowires 802 are now released in the source and drain regions of the device. As shown in FIG. 12, based on the timing/selectivity of the etching process, a portion of the buried insulator 204 may also be removed by this process.

Next, doped source and drain regions 1302 are formed. See FIG. 13. According to an exemplary embodiment, an epitaxial process is used to grow in-situ doped SiGe on the portions of the SiGe nanowires 802 extending out from the dummy gate 1004 to form the doped source and drain regions 1302 of the device. Alternatively, the dopant can be introduced via standard ion implantation techniques. Suitable n-type dopants include, but are not limited to phosphorous (P), and suitable p-type dopants include but are not limited to boron (B). The doped source and drain regions 1302 will now provide mechanical support for the SiGe nanowires during the subsequent replacement gate/nanowire suspension processes.

Namely, the dummy gate(s) 1004 will now be removed and replaced with a replacement gate(s), during which time, the SiGe nanowires 802 can be fully suspended in the channel region—allowing for a GAA configuration. In order to permit removal of the dummy gate(s) 1004, a dielectric material 1402 is first blanket deposited onto the structure and then polished down to, and exposing, the top surface of the dummy gate 1004. The dummy gate can then be removed selective to the dielectric material 1402/spacers 1102. See FIG. 14. As provided above, the dummy gate can be formed from poly-Si. In that case, a poly-Si selective RIE can be used to remove the dummy gate 1004.

Removal of the dummy gate 1004 will result in a trench (es) 1404 being formed in the dielectric material 1402. The replacement gate(s) will be formed in trench(es) 1404. Thus, trench(es) 1404 may also be referred to herein as gate trenches.

Figure 15:
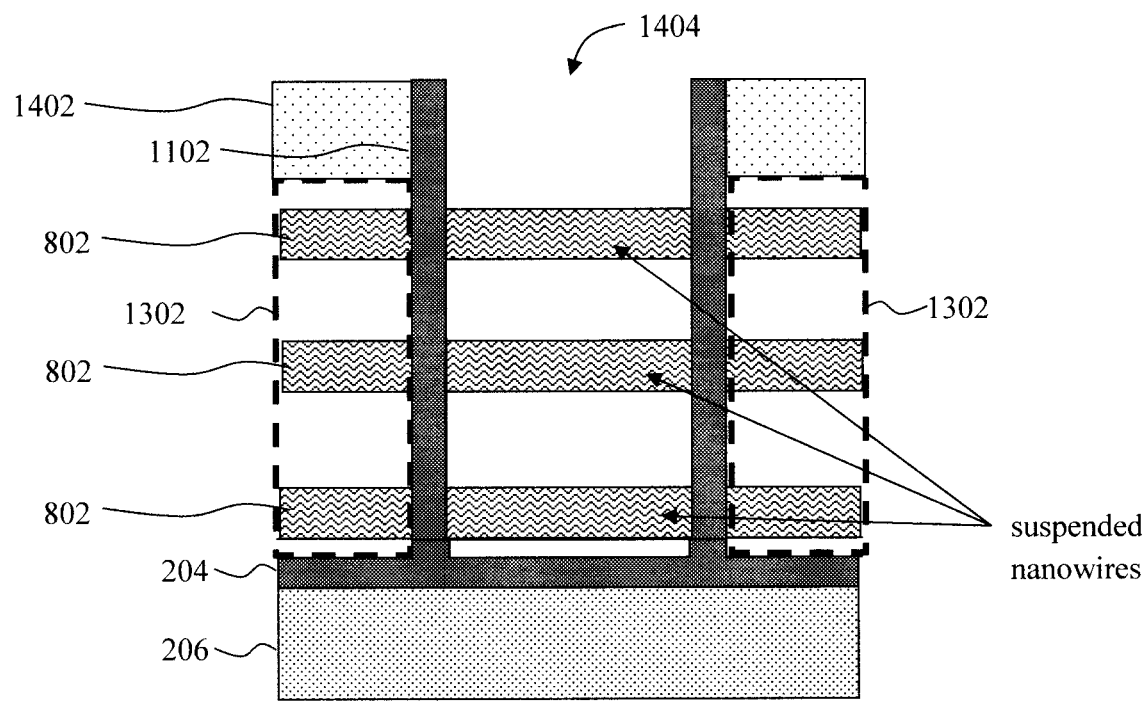
FIG. 15 is a cross-sectional diagram illustrating the SiGe nanowires having been suspended within the gate trench according to an embodiment of the present invention.

During the source and drain region processing (see above), the oxide material 702 was removed from the portions of the SiGe nanowires extending out from the gate, and replaced with doped epitaxial SiGe. To enable a gate-all-around (GAA) configuration, the oxide material 702 now needs to be removed from the channel region of the device, fully releasing the SiGe nanowires 802 in the channel region of the device. See FIG. 15. A suitable oxide-selective etching process for removing the oxide material 702 was described above. Based on the timing/selectivity of the etching process, a portion of the buried insulator 204 may also be removed by this process. As shown in FIG. 15, the SiGe nanowires 802 will now be suspended in the channel region of the device which will permit the replacement gate to be formed surrounding a portion of each of the SiGe nanowires 802 in a GAA configuration.

As noted above, without the present thinning of the SiGe layers in the fin stacks an undesired by-product of the condensation process is that parasitic Ge nanowires are formed between the SiGe nanowires. Thus, with conventional processes one must perform an extra step to remove the parasitic Ge nanowires. For instance, following release of the nanowires from the flowable oxide, an additional etch step can be used to remove the Ge nanowires selective to the SiGe nanowires in the channel region (removal of the parasitic nanowires is not necessary in the source and drain regions). However, due to the inevitable imperfect selectivity of the etch, the SiGe nanowires will also be etched to some degree during the removal process. As a result, with conventional process flows, the SiGe nanowires will be thinner (i.e., have a smaller diameter) in the channel region than in the source and drain regions. By contrast, with the present techniques, since no steps are needed to remove any parasitic nanowires (since they are not present to begin with), the SiGe nanowires will have a uniform diameter throughout the device (i.e., throughout the source, drain and channel regions).

A replacement gate 1602 is then formed in the gate trench surrounding a portion of each of the SiGe nanowires 802 which serve as the channel region of the device. See FIG. 16. This is what is referred to herein as a gate-all-around or GAA configuration. According to an exemplary embodiment, the replacement gate 1602 is a metal gate. Prior to depositing the metal gate, a gate dielectric (not shown) is typically deposited (e.g., conformally) on the nanowires within the gate trench, such that the gate dielectric separates the nanowire channels from the replacement gate. Suitable gate dielectrics for a replacement metal gate process include, but are not limited to, hafnium oxide ($HfO_2$) or lanthanum oxide ($La_2O_3$). By way of example only, one possible configuration of the replacement gate includes a workfunction setting metal layer onto the gate dielectric, and a filler gate metal layer on the workfunction setting metal layer. Suitable n-type workfunction setting metals include, but are not limited to, titanium nitride (TiN) and tantalum nitride (TaN). Suitable p-type workfunction setting metals include, but are not limited to, tungsten (W). Suitable filler gate metals include, but are not limited to, aluminum (Al).

Figure 16:
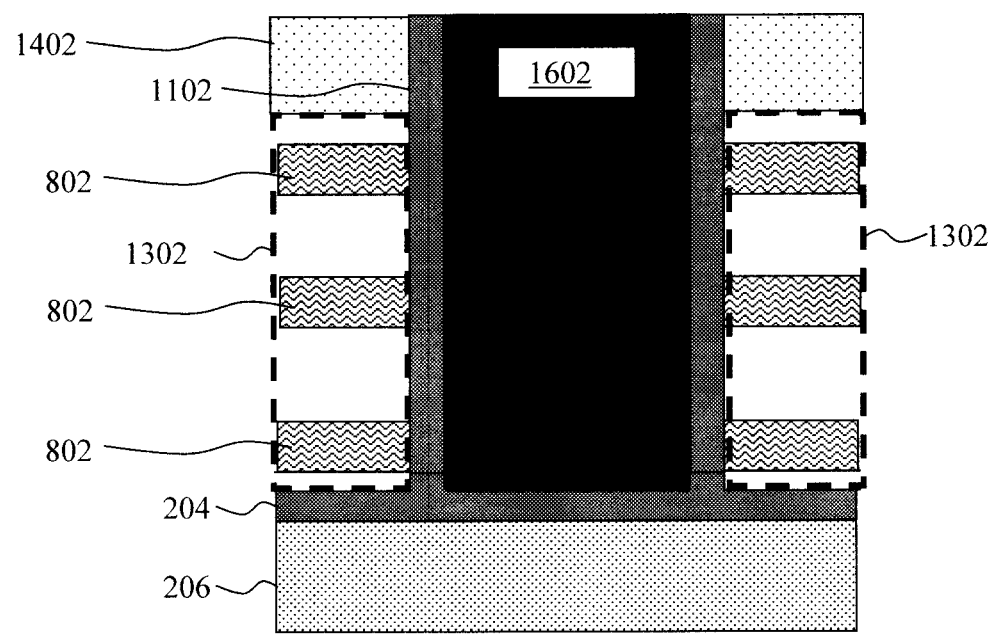
FIG. 16 is a cross-sectional diagram illustrating a replacement gate having been formed in the gate trench surrounding a portion of each of the SiGe nanowires in a gate-all-around (GAA) configuration according to an embodiment of the present invention.
Figure 17:
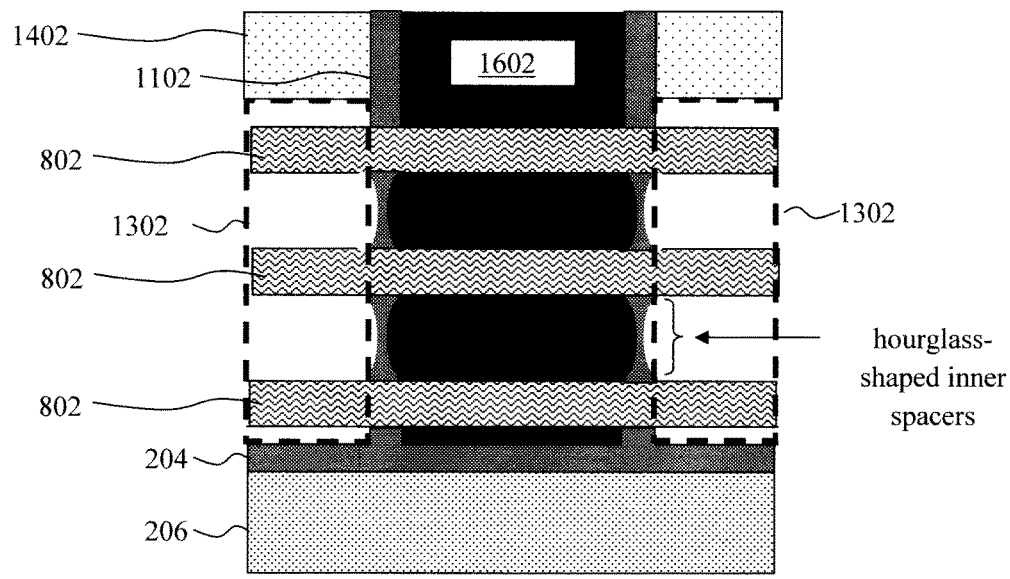
FIG. 17 is another cross-sectional diagram from a cut along the source and drain regions through one of the SiGe nanowire stacks illustrating the inner spacers having an hourglass-shape according to an embodiment of the present invention.

As provided above, the cut view shown in FIG. 16 is that through the replacement gate 1602, between two of the SiGe nanowire stacks (i.e., the same orientation as the view depicted in FIG. 11). To further illustrate some unique aspects of the present process, FIG. 17 is provided which illustrates a cut through the replacement gate 1602, through one of the SiGe nanowire stacks (see key 1000 in FIG. 10). As shown in FIG. 17, inner spacers are formed adjacent to the replacement gate 1602 having an hourglass shape. Specifically, as described above, the SiGe nanowires 802 are suspended in the source and drain regions (see, e.g., FIG. 12) and in the channel region (see, e.g., FIG. 15). During this process, a portion of the oxide material 702 present between the source/drain regions and the channel region is masked by the spacers 1102 and remains in between the source/drain regions and the channel region. This remaining material forms what are referred to herein as "inner spacers." See FIG. 17. Based on the present process, these inner spacers have a unique shape and unique properties. First, as shown in FIG. 17, the inner spacers have an hourglass shape. This is due to the etch processes described in conjunction with the description of FIGS. 12 and 15 above that is used to remove the oxide material 702 from between the SiGe nanowires 802 in the source/drain and channel regions, respectively. Namely, the etch used in those steps is isotropic which would create a curved surface of the oxide in between nanowires. The two curved surfaces (one in source/drain region and another in the channel region) would define the left and right boundaries of the inner spacers, forming their hourglass shape. Second, by comparison with conventional process flows, these inner spacers are seamless. Specifically, since the inner spacers (formed by oxide material 702) are formed by oxidizing the SiGe between nanowires rather than by deposited films, then there would be no seams or interfaces present in the material (i.e., the present oxidation process would remove any interface between original oxide from oxidation and deposited oxide).

In the exemplary SiGe nanowire-based FET process flow provided above, the SiGe nanowires are completely suspended in the channel region so as to enable a GAA configuration. The SiGe nanowires are also completely suspended in the source and drain regions. A potential challenge with a GAA/suspended nanowire configuration is that, even when suspended over short distances, the nanowires can undesirably sag due to the lack of physical support. Thus, an alternative nanowire-based FET process flow is also provided herein where the oxide material is trimmed between the SiGe nanowires, however a portion of the oxide is left in place (i.e., the SiGe nanowires are only partially released) in order to provide support and prevent sagging of the SiGe nanowires. This alternative embodiment is now described by way of reference to FIGS. 18-24.

The process begins in exactly the same manner as described above. Namely, a stack of alternating Si and SiGe layers is formed on the wafer, fins are patterned in the stack, the SiGe layers in the fins are selectively thinned giving the fins the above-described hourglass shape, epitaxial SiGe is selectively grown on the sidewalls of the Si layers in the fins, the fins are buried in an oxide material, and a thermal oxidation is performed to form the SiGe nanowires. Following the thermal oxidation, trenches are patterned in the oxide material between the stacks of SiGe nanowires. Thus, the following description begins with the structure shown and described in reference to FIG. 9 above. Like structures will be numbered alike.

Figure 18:
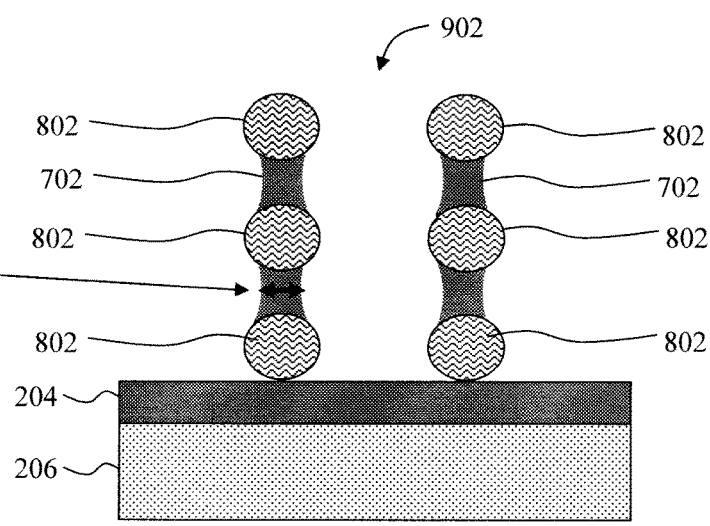
FIG. 18 (which follows from FIG. 9) is a cross-sectional diagram illustrating, according to an alternative exemplary implementation of the present techniques for forming a SiGe nanowire-based FET, the fin hardmasks having been removed, and the oxide material in between the SiGe nanowires having been thinned according to an embodiment of the present invention.

Following from FIG. 9, as shown in FIG. 18 the fin hardmasks 216a, 216b, etc. can be removed, followed by a thinning of the oxide material 702 in between the SiGe nanowires 802 in the stacks. As provided above, in order to maintain physical support of the SiGe nanowires 802, a portion of the oxide material 702 remains in between the SiGe nanowires 802 following the thinning (i.e., the SiGe nanowires are only partially released from the oxide material). This thinning step can be regulated to control how much of the circumference of the nanowires is exposed. For instance, increasing the amount of the oxide material 702 removed during the thinning would increase the amount of surface area of the nanowires that is exposed. Conversely, decreasing the amount of the oxide material removed during the thinning would decrease the amount of surface area of the nanowires that is exposed. See FIG. 18. According to an exemplary embodiment, the oxide material 702 is thinned used a chemical oxide removal or COR process. A suitable COR process is described, for example, in U.S. Patent Application Publication Number 2004/0185583 by Tomoyasu et al., entitled "Method of Operating a System for Chemical Oxide Removal," the contents of which are incorporated by reference as if fully set forth herein. It is notable that since the oxide thinning to partially release the nanowires is performed prior to placing the gate, this thinning occurs both in what will be the source/drain regions and the channel region. Thus, by comparison with the above process flow, the source/drain regions do not have to be processed separately from the channel region with respect to exposing the nanowires from the oxide. Namely, in the above process flow the channel region provides support for the nanowires while they are released in the source/drain regions, and vice versa. Here the nanowires are not fully released and therefore the oxide thinning for the source, drain, and channel regions can be performed in one step.

Figure 19:
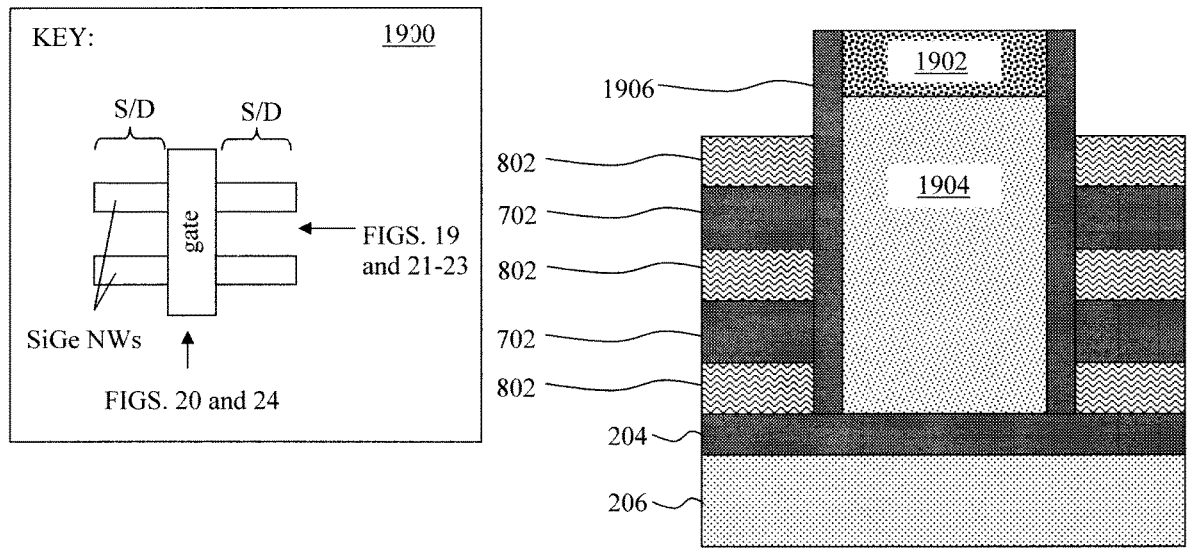
FIG. 19 is a cross-sectional diagram illustrating a dummy gate having been formed over the channel region, and dummy gate spacers having been formed on opposite sides of the dummy gate according to an embodiment of the present invention.

The same above-described replacement gate process can then be performed using a dummy gate(s) to place the source and drain regions which can then be removed and substituted with a replacement gate over the channel region of the device. Namely, as shown in FIG. 19, a dummy gate hardmask 1902 is used to form a dummy gate(s) 1904 (i.e., from a blanket layer of dummy gate material—see above).

A key 1900 is provided (to the left of FIG. 19) which shows the orientation of the views depicted in the figures. Specifically, the key 1900 is from a top-down perspective of the structure and shows the gate over the stacks of SiGe nanowire (labeled "SiGe NWs"). The gate shown in the key 1900 is generic for the dummy gate or the replacement gate. Thus, based on the key 9000, FIG. 19 illustrates a side view of the source to drain region from a cross-sectional cut between two of the stacks of the SiGe nanowires 802. As shown in FIG. 19, dummy gate spacers 1906 are next formed on opposite sides of the dummy gate 1904. The formation of dummy gate spacers was described in detail above.

Figure 20:
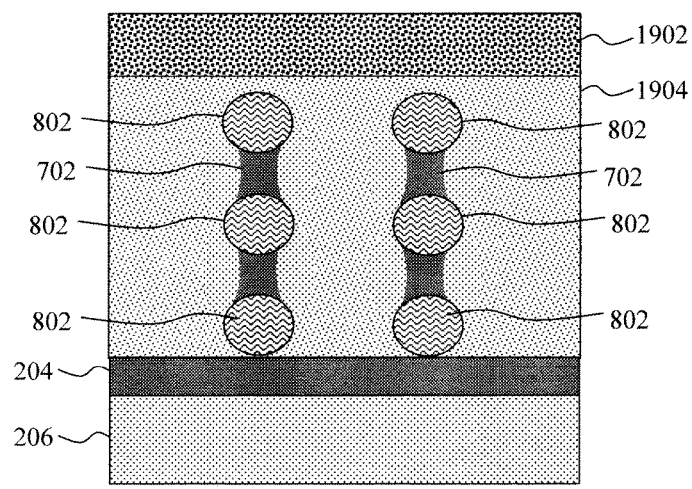
FIG. 20 is another cross-sectional diagram of the dummy gate according to an embodiment of the present invention.

FIG. 20 provides a different perspective via a cross-sectional cut along the length of the dummy gate 1904. See key 1900.

Figure 21:
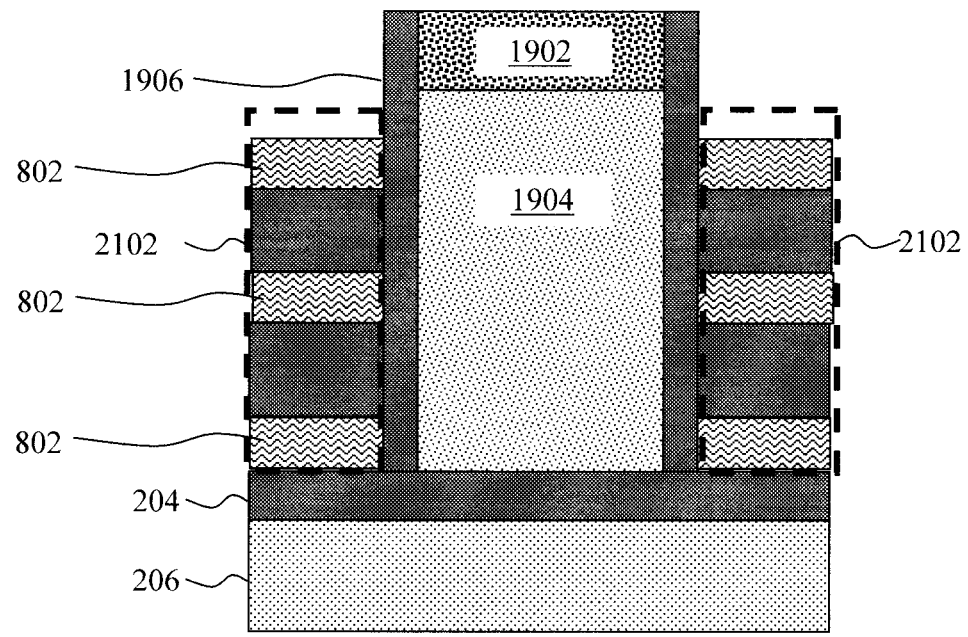
FIG. 21 is a cross-sectional diagram illustrating doped source and drain regions of the device having been formed according to an embodiment of the present invention.
Figure 22:
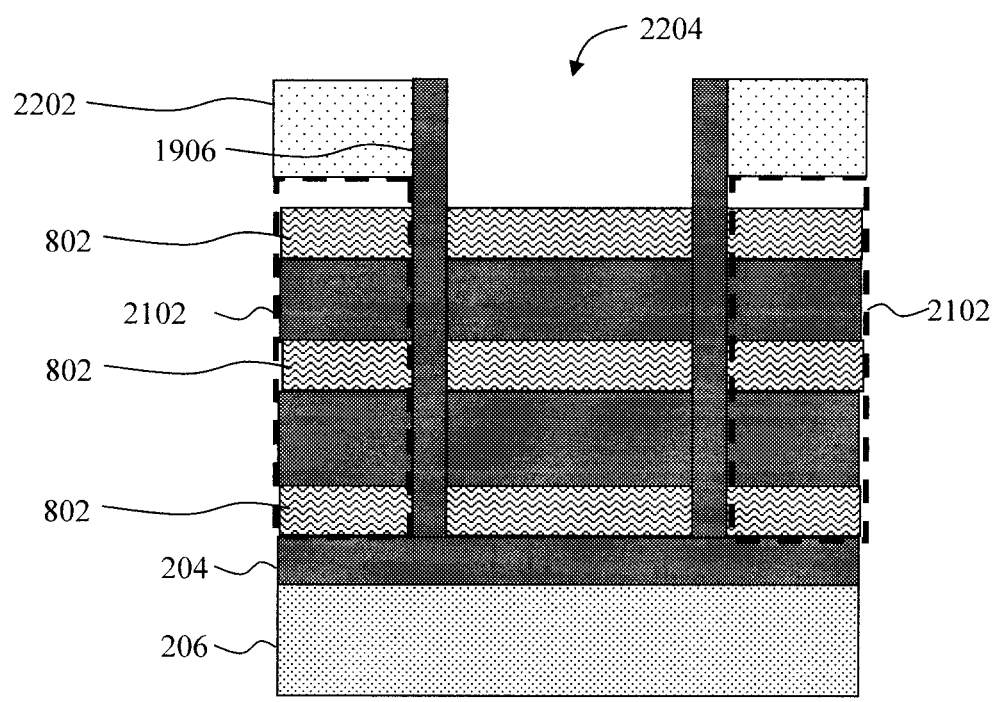
FIG. 22 is a cross-sectional diagram illustrating a dielectric material having been deposited onto the structure and the dummy gate having been removed selective to the dielectric material forming a trench (i.e., a gate trench) in the dielectric material according to an embodiment of the present invention.
Figure 23:
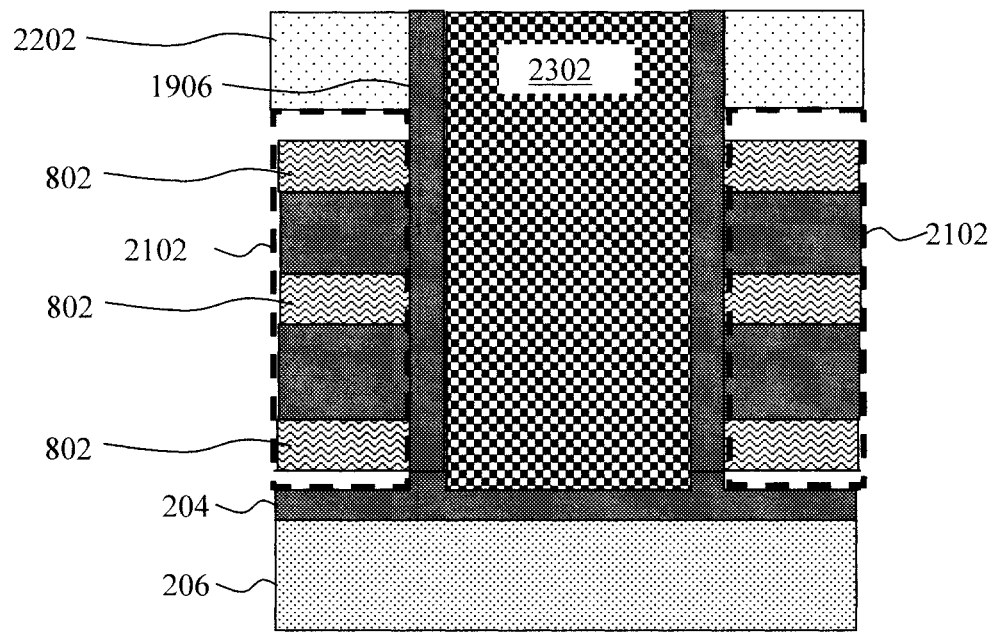
FIG. 23 is a cross-sectional diagram illustrating a replacement gate having been formed in the gate trench partially surrounding a portion of each of the SiGe nanowires according to an embodiment of the present invention.

Next, as shown in FIG. 21, doped source and drain regions 2102 are formed. FIGS. 21-23 will depict the same perspective of the device structure as that of FIG. 11 (i.e., a side view of the source to drain from a cut between two of the nanowire stacks). As provided above, the oxide material 702 was previously thinned in both the source/drain and channel regions. Thus no further oxide processing is needed. In the same manner as described above, an epitaxial process may be used to grow in-situ doped SiGe on the portions of the SiGe nanowires 802 extending out from the dummy gate 1904 to form the doped source and drain regions 2102 of the device. Alternatively, the dopant can be introduced via standard ion implantation techniques. Suitable n-type dopants include, but are not limited to phosphorous (P), and suitable p-type dopants include but are not limited to boron (B).

The dummy gate(s) 1904 are now removed and replaced with a replacement gate(s). In order to permit removal of the dummy gate(s) 1904, a dielectric material 2202 is first blanket deposited onto the structure and then polished down to, and exposing, the top surface of the dummy gate 1904. The dummy gate can then be removed selective to the dielectric material 2202/spacers 1906. See FIG. 22. Removal of the dummy gate 1904 will result in a trench(es) 2204 being formed in the dielectric material 2202. The replacement gate(s) will be formed in trench(es) 2204. Thus, trench(es) 2204 may also be referred to herein as gate trenches.

A replacement gate 2302 is then formed in the gate trench partially surrounding a portion of each of the SiGe nanowires 802 which serve as the channel region of the device. See FIG. 23. As provided above, a portion of the oxide material 702 remains in between the SiGe nanowires 802. Thus, in this example, the replacement gate does not fully surround each of the nanowires. However, according to the above-described process, the oxide thinning can be configured to expose a sufficient surface area of each of the nanowires to the replacement gate.

According to an exemplary embodiment, the replacement gate 2202 is a metal gate. Prior to depositing the metal gate, a gate dielectric (see FIG. 23, described below) is typically deposited (e.g., conformally) on the nanowires within the gate trench, such that the gate dielectric separates the nanowire channels from the replacement gate. Suitable gate dielectrics were provided above. By way of example only, one possible configuration of the replacement gate includes a workfunction setting metal layer onto the gate dielectric, and a filler gate metal layer on the workfunction setting metal layer. Suitable n-type and p-type workfunction setting metals and suitable filler gate metals were provided above.

Figure 24:
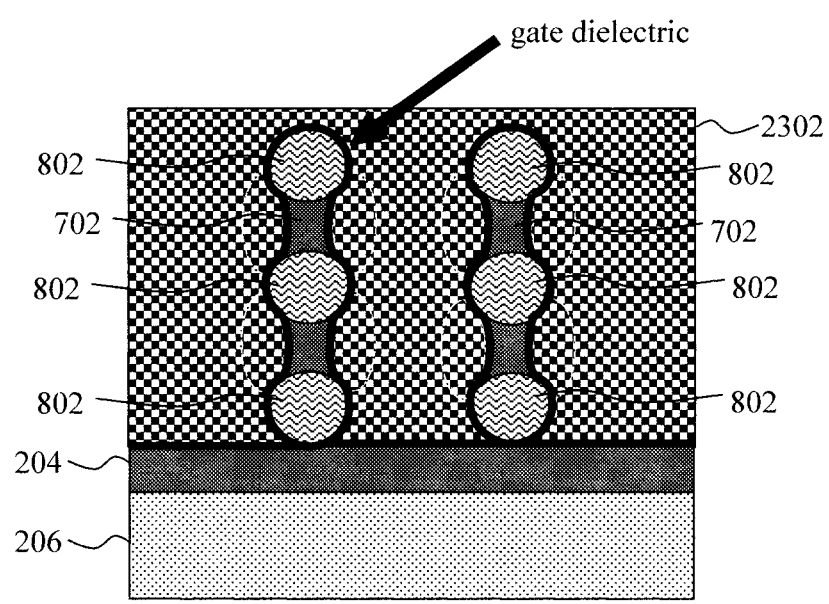
FIG. 24 is another cross-sectional diagram of the replacement gate according to an embodiment of the present invention.

The cut view shown in FIG. 23 is that through the replacement gate 2302, between two of the SiGe nanowire stacks (i.e., the same orientation as the view depicted in FIG. 19). FIG. 24 is also provided which illustrates a cut through the replacement gate 2302 perpendicular to the SiGe nanowire stacks (see key 1900 in FIG. 19). As shown in FIG. 24, the replacement gate 2302 partially surrounds each of the SiGe nanowires 802.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field effect transistor (FET) device, comprising:
   at least one stack of silicon germanium (SiGe) nanowires; and
   a gate at least partially surrounding a portion of each of the SiGe nanowires that serves as a channel region of the FET device, wherein portions of the SiGe nanowires extending out from the gate serve as source and drain regions of the FET device, and wherein the SiGe nanowires have a uniform diameter throughout the source, drain, and channel regions of the FET device,
   wherein the gate only partially surrounds the portion of each of the SiGe nanowires, and wherein the FET device further comprises an oxide material between the SiGe nanowires which physically supports the SiGe nanowires in both the channel region and in the source and drain regions of the FET device.

2. The FET device of claim 1, further comprising inner spacers between the channel region and the source and drain regions.

3. The FET device of claim 2, wherein the inner spacers are formed from an oxide material.

4. The FET device of claim 1, wherein the gate fully surrounds the portion of each of the SiGe nanowires in a gate-all-around (GAA) configuration.

5. The FET device of claim 1, wherein the gate is a metal gate.

6. The FET device of claim 5, wherein the gate comprises an n-type workfunction setting metal.

7. The FET device of claim 6, wherein the n-type workfunction setting metal is selected from the group consisting of: titanium nitride and tantalum nitride.

8. The FET device of claim 5, wherein the gate comprises a p-type workfunction setting metal.

9. The FET device of claim 8, wherein the p-type workfunction setting metal is tungsten.

10. The FET device of claim 1, wherein the oxide material contacts only a portion of each of the SiGe nanowires.

11. The FET device of claim 10, further comprising:
    a gate dielectric separating the SiGe nanowires from the gate, wherein the gate dielectric is selected from the group consisting of: hafnium oxide and lanthanum oxide, and wherein the gate dielectric is disposed as a conformal layer on the SiGe nanowires and on the oxide material between the SiGe nanowires.

12. The FET device of claim 1, further comprising:
    a gate dielectric separating the SiGe nanowires from the gate, wherein the gate dielectric is selected from the group consisting of: hafnium oxide and lanthanum oxide.

13. The FET device of claim 12, wherein the gate dielectric is disposed as a conformal layer on the SiGe nanowires.

14. The FET device of claim 1, further comprising:
    epitaxial SiGe on the portions of the SiGe nanowires extending out from the gate in the source and drain regions of the FET device.

15. The FET device of claim 14, wherein the epitaxial SiGe fully surrounds the portions of the SiGe nanowires extending out from the gate in the source and drain regions of the FET device.

16. The FET device of claim 14, wherein the epitaxial SiGe is doped with an n-type dopant.

17. The FET device of claim 14, wherein the epitaxial SiGe is doped with a p-type dopant.

18. The FET device of claim 1, wherein the SiGe nanowires comprise from about 10% to about 60% germanium (Ge), and ranges therebetween.

* * * * *